(12) United States Patent
Jung

(10) Patent No.: US 7,101,766 B2
(45) Date of Patent: Sep. 5, 2006

(54) METHODS OF FABRICATING SEMICONDUCTOR DEVICE HAVING T-SHAPED GATE AND L-SHAPED SPACER

(75) Inventor: Jin-Suk Jung, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 24 days.

(21) Appl. No.: 11/006,168

(22) Filed: Dec. 7, 2004

(65) Prior Publication Data

US 2005/0124104 A1 Jun. 9, 2005

(30) Foreign Application Priority Data

Dec. 8, 2003 (KR) ...................... 10-2003-0088721

(51) Int. Cl.
*H01L 21/336* (2006.01)
(52) U.S. Cl. ................ 438/304; 438/596; 257/E21.205
(58) Field of Classification Search ................ 438/304, 438/596
See application file for complete search history.

(56) References Cited

U.S. PATENT DOCUMENTS

| | | | |
|---|---|---|---|
| 4,599,790 A | 7/1986 | Kim et al. | ..................... 29/571 |
| 5,290,720 A * | 3/1994 | Chen | ........................... 438/304 |
| 5,920,783 A * | 7/1999 | Tseng et al. | ................. 438/305 |
| 6,087,234 A | 7/2000 | Wu | ............................. 438/299 |
| 6,541,328 B1 | 4/2003 | Whang et al. | .............. 438/231 |

FOREIGN PATENT DOCUMENTS

KR 03-50792 6/2003

* cited by examiner

*Primary Examiner*—Chandra Chaudhari
(74) *Attorney, Agent, or Firm*—Mills & Onello LLP

(57) ABSTRACT

There are provided methods of fabricating a semiconductor device having a T-shaped gate and an L-shaped spacer. In the method, an insulating layer and a sacrificial layer are formed in sequence on a semiconductor substrate having a vertical gate pattern. By etching the sacrificial layer, a sacrificial spacer is formed. By etching the insulating layer until an upper surface of at least the vertical gate pattern is exposed, there is formed an L-shaped spacer, which includes a vertical portion located between sidewalls of the vertical gate pattern and the sacrificial spacer, and a horizontal portion extended from the vertical portion and located between the semiconductor substrate and the sacrificial spacer. By selectively etching a part of the vertical portion of the L-shaped spacer, an empty space is formed between upper sidewalls of the vertical gate pattern and the sacrificial spacer. A horizontal gate pattern, which is formed of a conductive layer to fill at least the empty space, is formed, and thus, there is formed a T-shaped gate being composed of the vertical gate pattern and the horizontal gate pattern.

30 Claims, 18 Drawing Sheets

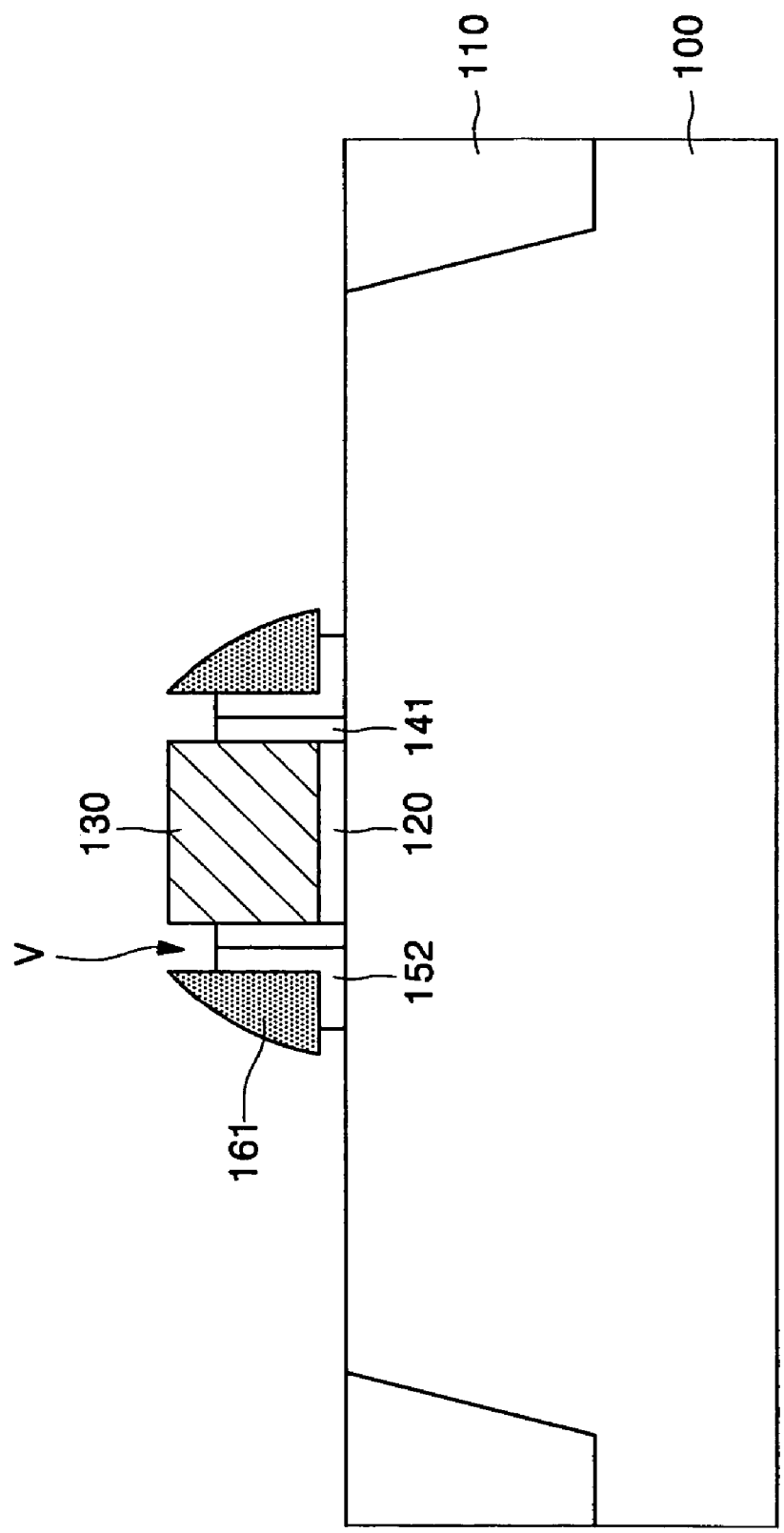

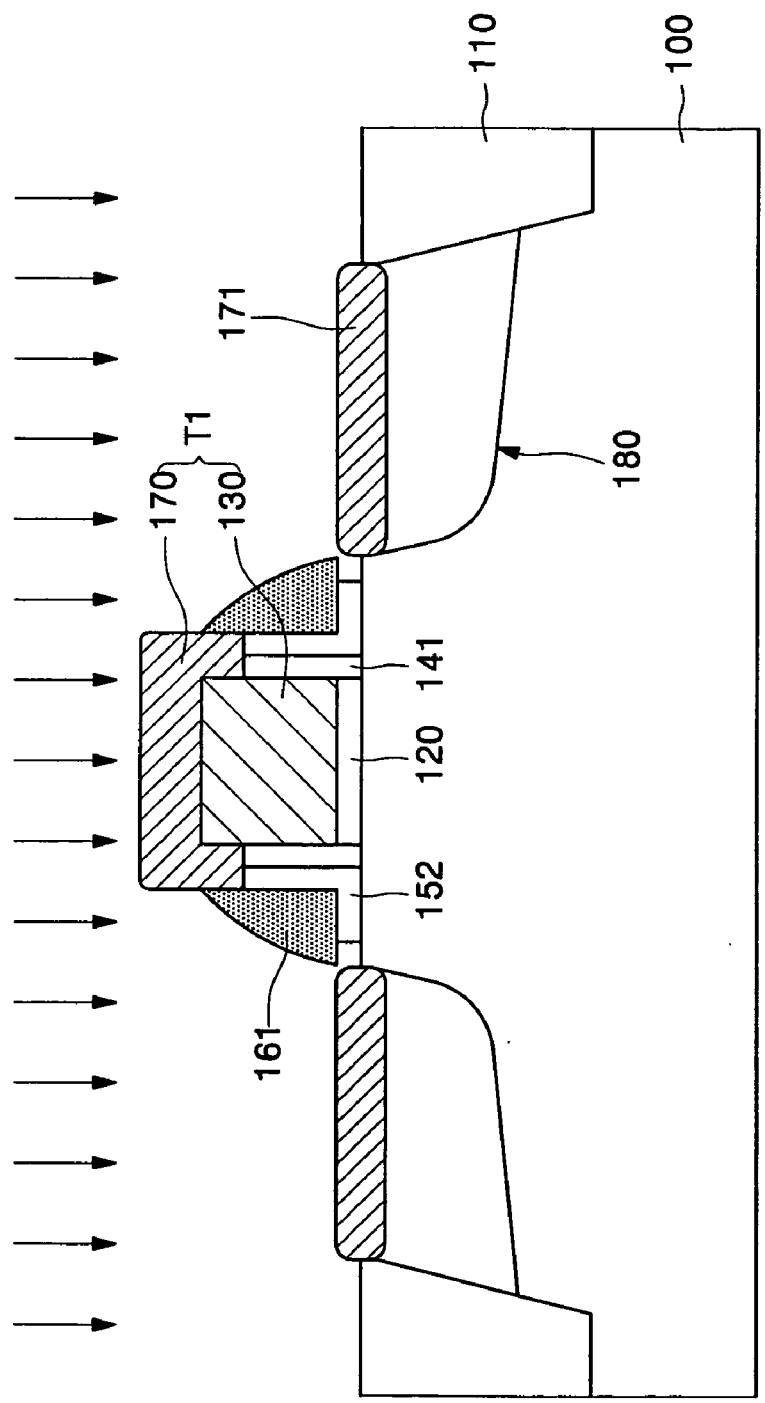

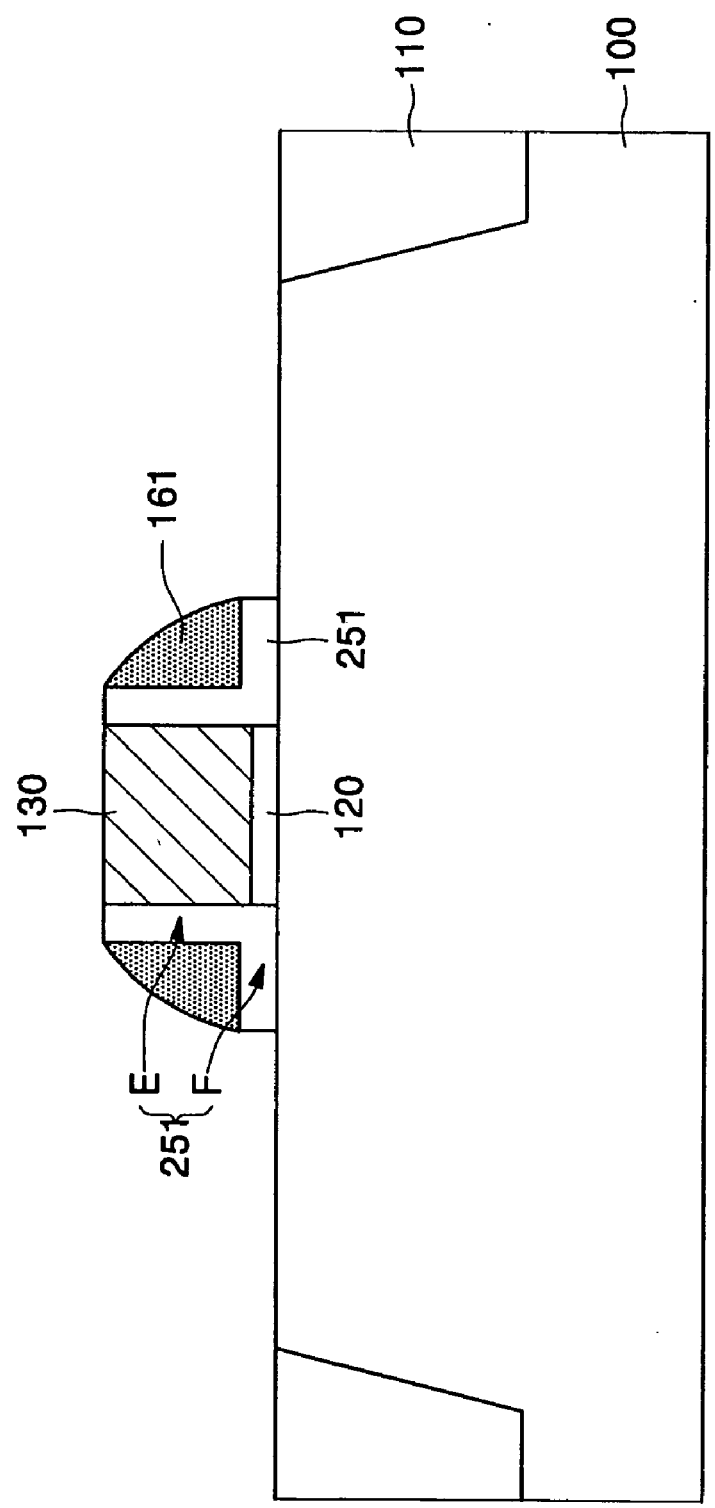

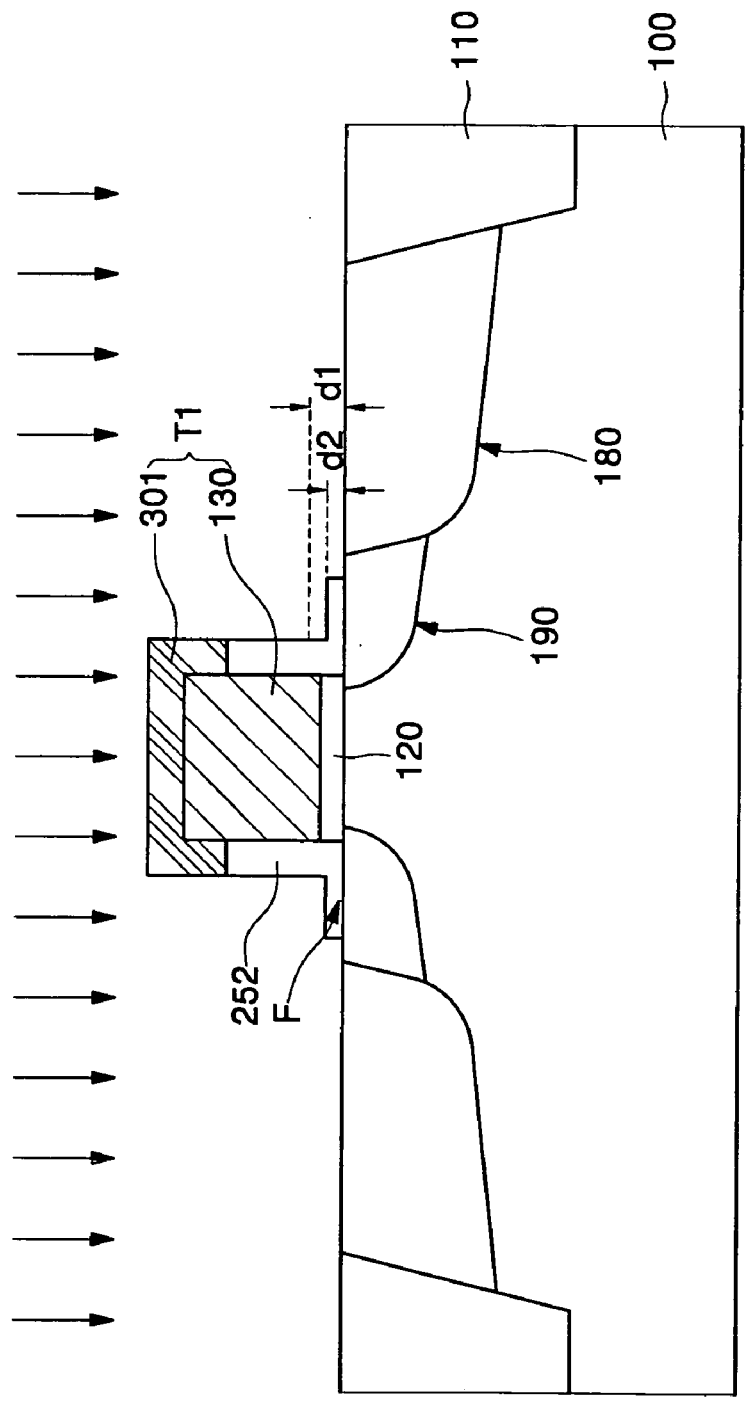

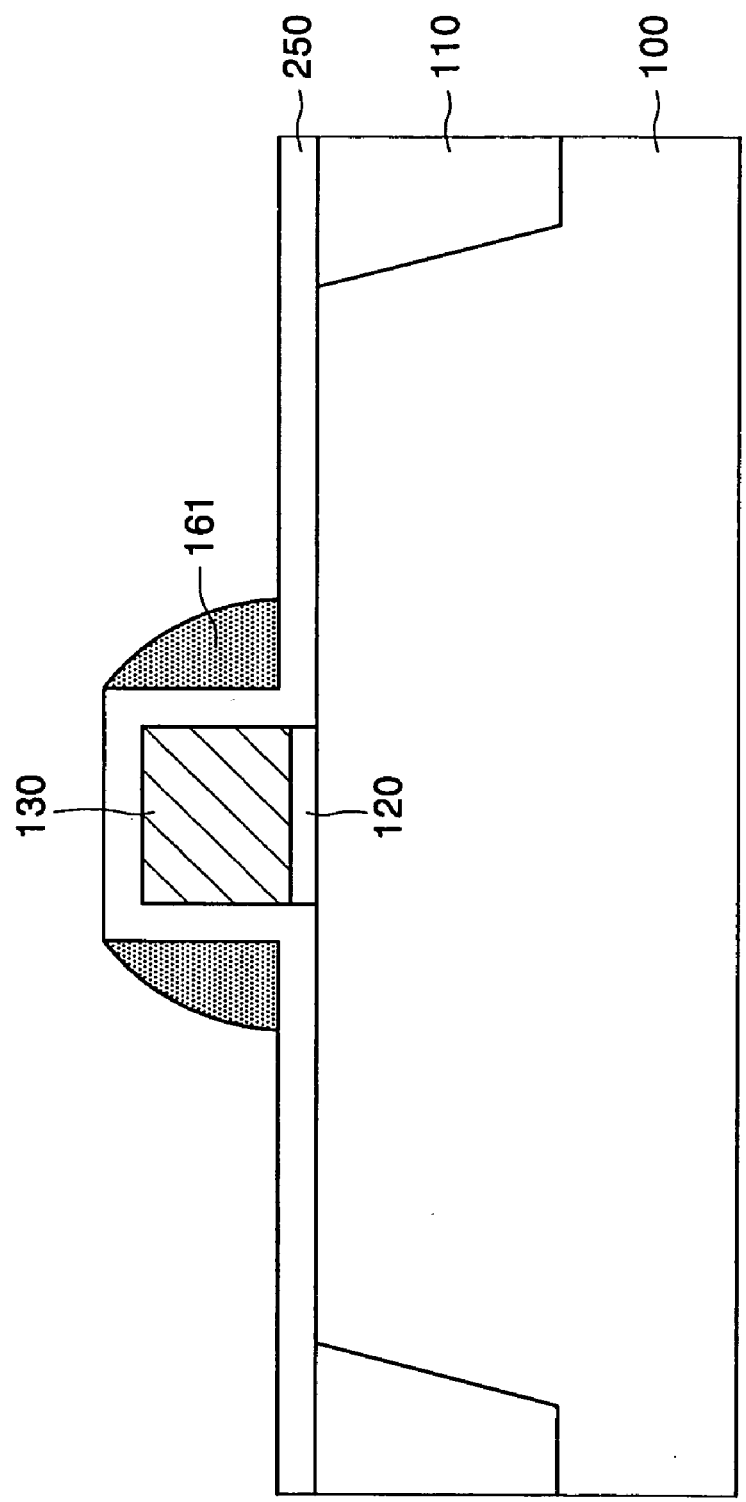

METHODS OF FABRICATING SEMICONDUCTOR DEVICE HAVING T-SHAPED GATE AND L-SHAPED SPACER

CROSS-REFERENCE TO RELATED APPLICATION

This application claims the benefit of Korean Patent Application No. 2003-88721, filed Dec. 8, 2003, the contents of which are hereby incorporated herein by reference in their entirety.

BACKGROUND

1. Technical Field

The present invention relates to fabrication of semiconductor devices and more particularly, to methods of fabricating a semiconductor device having a T-shaped gate and an L-shaped spacer.

2. Discussion of the Related Art

With the improvement of high integration of semiconductor devices and the design trend of a low-power consumption thereof, length of the gate of a transistor is reduced, and operation voltage is also reduced. With the reduction of a design rule for high integration of a semiconductor device, since a parasitic capacitance is increased and a short channel effect occurs, speed of the device is reduced. Furthermore, with the narrowness of widths of a gate and source/drain regions, silicide is difficult to form, and thus, a high-performance transistor is difficult to provide.

For example, as shown in FIG. 1, a semiconductor device with a conventional technology includes a gate insulating layer 11 formed on a semiconductor substrate 10, a gate 12, and source/drain regions 14 formed inside the semiconductor substrate 10 at both ends of the gate 12. Insulating layer spacers 13 are formed on the sidewalls of the gate insulating layer 11 and the gate 12. The gate 12 and the source/drain regions 14 are covered with silicide layers 15a, 15b to reduce contact resistance.

Since the size of the gate 12 is reduced with the improvement of high integration of a semiconductor device, a doping concentration of the source/drain regions 14 is increased in order to suppress the generation of a short channel effect. However, if the doping concentration is increased, an overlap width W1 of the gate 12 and the source/drain regions 14 is increased, and an overlap capacitance (Cov) between the gate and the source/drain regions, as one of parasitic capacitances, is increased. Due to the parasitic capacitance, a speed of the device, which is composed of millions of transistors, is reduced, and thus, power consumption is increased.

A structure of a T-shaped gate to reduce contact resistance is disclosed in U.S. Pat. No. 4,599,790, entitled, "Process for forming a T-shaped gate", issued to Kim, et. al.

Referring to FIG. 2, a T-shaped gate 21 is composed of an upper region 21a having a relatively large width, and a lower region 21b being relatively narrow in width. That is, a width W2 of an upper region 21a as a silicide formation region is maintained, and an overlap area between the T-shaped gate 21 formed on the semiconductor substrate 20 and the source/drain regions 22 formed inside the semiconductor substrate 20 can be reduced. Thus, with the presence of the T-shaped gate 21, the reduction of speed of a device due to the parasitic capacitance can be prevented.

In order to solve the problem that hot carriers are injected into a gate insulating layer by the short channel effect, a lightly doped drain (LDD) structure has been introduced. As one of the methods of forming such an LDD structure, L-shaped spacers are formed on the sidewalls of a gate, and low concentration source/drain regions and high concentration source/drain regions are formed using the gate and the L-shaped spacers as ion implantation masks.

FIG. 3 is a sectional view schematically illustrating a structure of a semiconductor device having a conventional L-shaped spacer, which is disclosed in U.S. Pat. No. 6,087,234, entitled, "Method of forming a self-aligned silicide MOSFET with an extended ultra-shallow S/D junction," issued to Shye-Lin Wu, et. al.

As shown in FIG. 3, a semiconductor device having a conventional L-shaped spacer includes L-shaped spacers 33 covering the sidewalls of a gate insulating layer 31 and a gate 32, and a semiconductor substrate 30 around them. Low concentration source/drain regions 34a are formed inside the semiconductor substrate 30, overlapping the L-shaped spacer 33, and high concentration source/drain regions 34b are formed overlapping the low concentration source/drain regions 34a.

In the semiconductor device having a typical spacer as shown in FIG. 1, if an interval between the neighboring gates 12 becomes too small, it is difficult to deposit a metal layer between the spacers 13 covering the sidewalls of the gate. Thus, with the increased integration of the device, it is difficult to form a silicide layer 15b in the source/drain regions 14. On the contrary, in the semiconductor device as shown in FIG. 3, a metal layer can be readily deposited even on the semiconductor substrate adjacent to the L-shaped spacer 33, so as to provide a sufficient area for the silicide layer 35b covering the source/drain regions 34.

As such, the semiconductor device having the T-shaped gate can have a sufficient enough area of the gate silicide layer, and can reduce an overlap area of the gate and the source/drain regions. Further, the semiconductor device having the L-shaped spacer can have a sufficient enough area of the silicide layer covering the source/drain regions. However, it is not easy to form the L-shaped spacer on the sidewalls of the gate because of the structural characteristics of the T-shaped gate. Therefore, it is necessary to provide a method of easily fabricating the semiconductor device having the L-shaped spacer on the sidewalls of the T-shaped gate.

SUMMARY OF THE INVENTION

Therefore, the present invention is directed to methods of fabricating a semiconductor device having a T-shaped gate and an L-shaped spacer.

In accordance with an exemplary embodiment of the present invention, the method of fabricating a semiconductor device includes forming a vertical gate pattern on a semiconductor substrate. An insulating layer and a sacrificial layer are formed in sequence on the semiconductor substrate having the vertical gate pattern. The sacrificial layer may be formed of a material having an etch selectivity with respect to the insulating layer. By etching the sacrificial layer, a sacrificial spacer is formed. By etching the insulating layer until at least an upper surface of the vertical gate pattern is exposed, an L-shaped spacer is formed. The L-shaped spacer may include a vertical portion located between sidewalls of the vertical gate pattern and the sacrificial spacer, and a horizontal portion extended from the vertical portion and located between the semiconductor substrate and the sacrificial spacer. By selectively etching a part of the vertical portion of the L-shaped spacer, an empty space is formed between upper sidewalls of the vertical gate pattern and the sacrificial spacer. Then, a horizontal gate pattern, which is formed of a conductive layer to fill at least the empty space, may be formed, so as to provide a T-shaped gate composed of the vertical gate pattern and the horizontal gate pattern. Then, the sacrificial spacer is removed.

In one embodiment, the method further comprises, after removing the sacrificial spacer, reducing a thickness of the horizontal portion of the L-shaped spacer.

In one embodiment, forming the horizontal gate pattern comprises forming a conductive layer on an upper surface and upper sidewalls of the vertical gate pattern by a selective growth method. Forming the horizontal gate pattern comprises forming a first epitaxial layer on an upper surface and upper sidewalls of the vertical gate pattern. While the horizontal gate pattern is formed, a second epitaxial layer is formed on the semiconductor substrate at both ends of the sacrificial spacer. After forming the first epitaxial layer and the second epitaxial layer, an ion implantation can be performed to form high concentration source/drain regions using the T-shaped gate and the sacrificial spacer as ion implantation masks. After removing the sacrificial spacer, an ion implantation can be performed using the T-shaped gate and the L-shaped spacer as ion implantation masks, to form low concentration source/drain regions inside the semiconductor substrate, overlapping the horizontal portion of the L-shaped spacer. After removing the sacrificial spacer, a thickness of the horizontal portion of the L-shaped spacer can be reduced.

In one embodiment, the vertical gate pattern, the first epitaxial layer and the second epitaxial layer are formed of a material containing silicon. In one embodiment, the method further comprises: forming a metal layer on the semiconductor substrate having the first epitaxial layer and the second epitaxial layer; performing a thermal treatment to react the first epitaxial layer and the second epitaxial layer with the metal layer, so as to form silicide layers on the T-shaped gate pattern and the semiconductor substrate; and removing the metal layer remaining after the silicide layers are formed.

In one embodiment, forming the horizontal gate pattern comprises: forming a conductive layer on the semiconductor substrate having the empty space; and patterning the conductive layer. In one embodiment, the conductive layer is formed of a polysilicon layer. In one embodiment, the method further comprises, after forming the horizontal gate pattern, performing an ion implantation using the T-shaped gate and the sacrificial spacer as ion implantation masks, to form high concentration source/drain regions. In one embodiment, the method further comprises, after removing the sacrificial spacer, performing an ion implantation using the T-shaped gate and the L-shaped spacer as ion implantation masks, to form low concentration source/drain regions. In one embodiment, the method further comprises, after removing the sacrificial spacer, reducing a thickness of the horizontal portion of the L-shaped spacer.

In one embodiment, the method further comprises, after sequentially forming the insulating layer and the sacrificial layer: overall-etching the sacrificial layer until an upper surface of the insulating layer is exposed, so as to form the sacrificial spacer; and etching the insulating layer exposed after the sacrificial spacer is formed, so as to form the L-shaped spacer and the empty space at the same time.

In accordance with another exemplary embodiment of the present invention, the method of fabricating a semiconductor device includes forming a vertical gate pattern on a semiconductor substrate. An insulating layer spacer is formed on sidewalls of the vertical gate pattern. An insulating layer and a sacrificial layer may be formed in sequence on the semiconductor substrate having the insulating layer spacer. The sacrificial layer may be formed of a material having an etch selectivity with respect to the insulating layer. By etching the sacrificial layer, a sacrificial spacer is formed. By etching the insulating layer until at least an upper surface of the vertical gate pattern is exposed, an L-shaped spacer is formed. The L-shaped spacer may include a vertical portion located between the insulating layer spacer and the sacrificial spacer, and a horizontal portion extended from the vertical portion and located between the semiconductor substrate and the sacrificial spacer. By selectively etching parts of the vertical portion of the L-shaped spacer and the insulating layer spacer, an empty space is formed between upper sidewalls of the vertical gate pattern and the sacrificial spacer. A horizontal gate pattern, which is formed of a conductive layer to fill at least the empty space, is formed, to provide a T-shaped gate composed of the vertical gate pattern and the horizontal gate pattern. The sacrificial spacer is removed.

In one embodiment, forming the horizontal gate pattern comprises forming a conductive layer on an upper surface and upper sidewalls of the vertical gate pattern by a selective growth method.

In one embodiment, forming the horizontal gate pattern comprises forming a first epitaxial layer on an upper surface and upper sidewalls of the vertical gate pattern.

In one embodiment, while the horizontal gate pattern is formed, a second epitaxial layer is formed on the semiconductor substrate at both ends of the sacrificial spacer.

In one embodiment, the method further comprises, after forming the first epitaxial layer and the second epitaxial layer, performing an ion implantation to form high concentration source/drain regions using the T-shaped gate and the sacrificial spacer as ion implantation masks.

In one embodiment, the method further comprises, after removing the sacrificial spacer, performing an ion implantation using the T-shaped gate and the L-shaped spacer as ion implantation masks, in order to form low concentration source/drain regions inside the semiconductor substrate, overlapping the horizontal portion of the L-shaped spacer.

In one embodiment, the method further comprises, after removing the sacrificial spacer, reducing a thickness of the horizontal portion of the L-shaped spacer. The vertical gate pattern, the first epitaxial layer and the second epitaxial layer can be formed of a material containing silicon. In one embodiment, the method further comprises: forming a metal layer on the semiconductor substrate having the first epitaxial layer and the second epitaxial layer; performing a thermal treatment to react the first epitaxial layer and the second epitaxial layer with the metal layer, so as to form silicide layers on the T-shaped gate pattern and the semiconductor substrate; and removing the metal layer remaining after the silicide layers are formed.

In one embodiment, forming the horizontal gate pattern comprises: forming a conductive layer on the semiconductor substrate having the empty space; and patterning the conductive layer. In one embodiment, the conductive layer is formed of a polysilicon layer. In one embodiment, the method further comprises, after forming the horizontal gate pattern, performing an ion implantation using the T-shaped gate and the sacrificial spacer as ion implantation masks, to form high concentration source/drain regions. In one embodiment, the method further comprises, after removing the sacrificial spacer, performing an ion implantation using the T-shaped gate and the L-shaped spacer as ion implantation masks, to form low concentration source/drain regions. In one embodiment, the method further comprises, after removing the sacrificial spacer, reducing a thickness of the horizontal portion of the L-shaped spacer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 4A to 4H are cross-sectional views illustrating a method of fabricating a semiconductor device according to one embodiment of the present invention.

FIGS. 5A to 5F are cross-sectional views illustrating a method of fabricating a semiconductor device according to another embodiment of the present invention.

FIGS. 6A and 6B are cross-sectional views illustrating a method of fabricating a semiconductor device according to still another embodiment of the present invention.

DETAILED DESCRIPTION OF THE INVENTION

FIGS. 4A to 4H are cross-sectional views illustrating a method of fabricating a semiconductor device according to one embodiment of the present invention.

Figure 1:
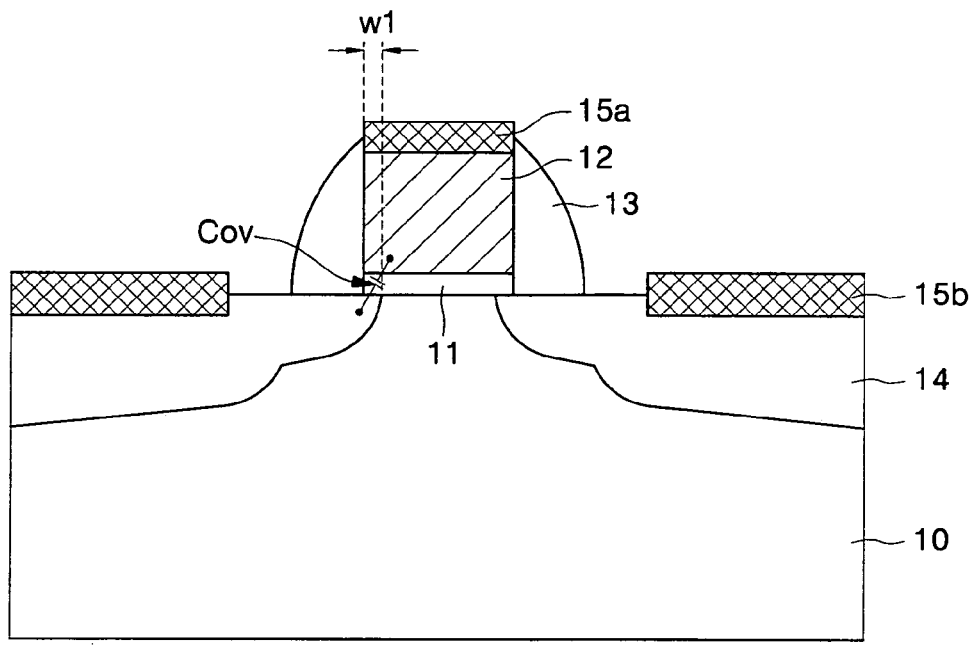
FIG. 1 is a cross-sectional view illustrating a conventional semiconductor device having a typical gate and a spacer.
Figure 2:
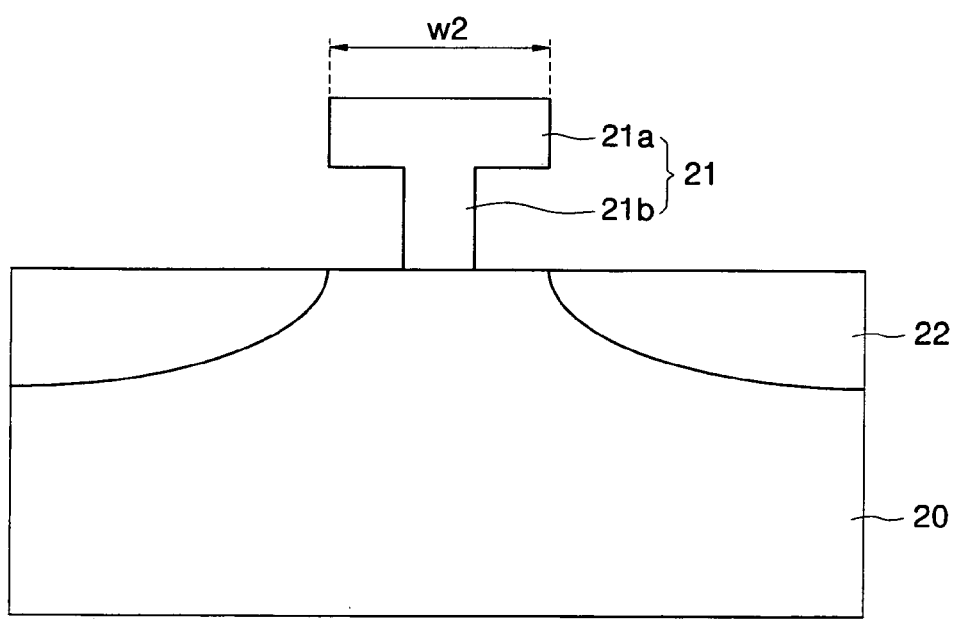
FIG. 2 is a cross-sectional view illustrating another conventional semiconductor device having a T-shaped gate.
Figure 3:
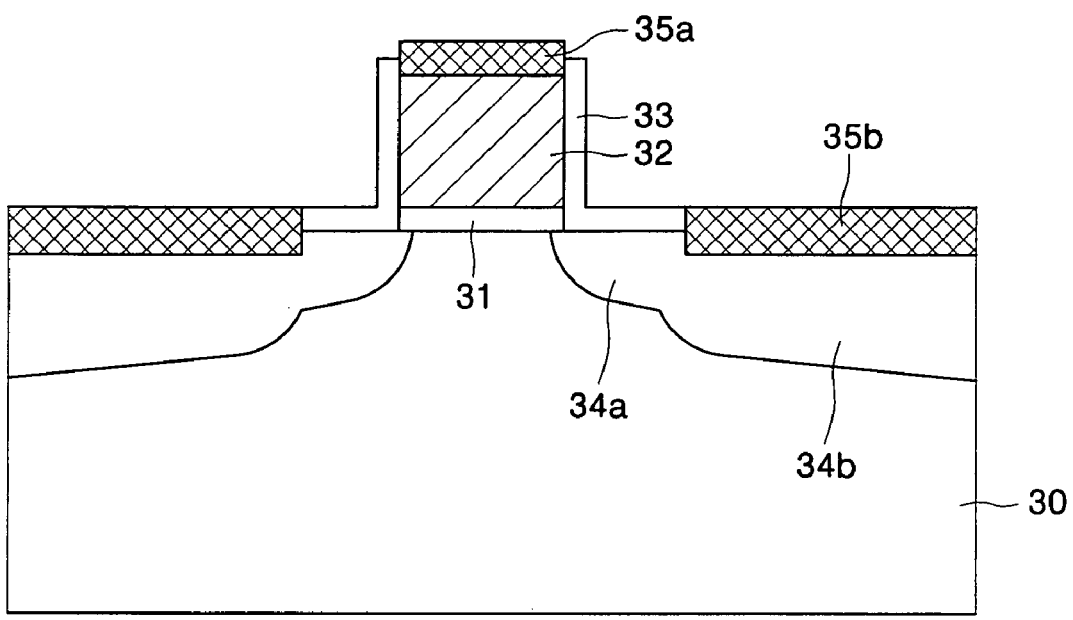
FIG. 3 is a cross-sectional view illustrating still another conventional semiconductor device having an L-shaped spacer.
Figure 4A:
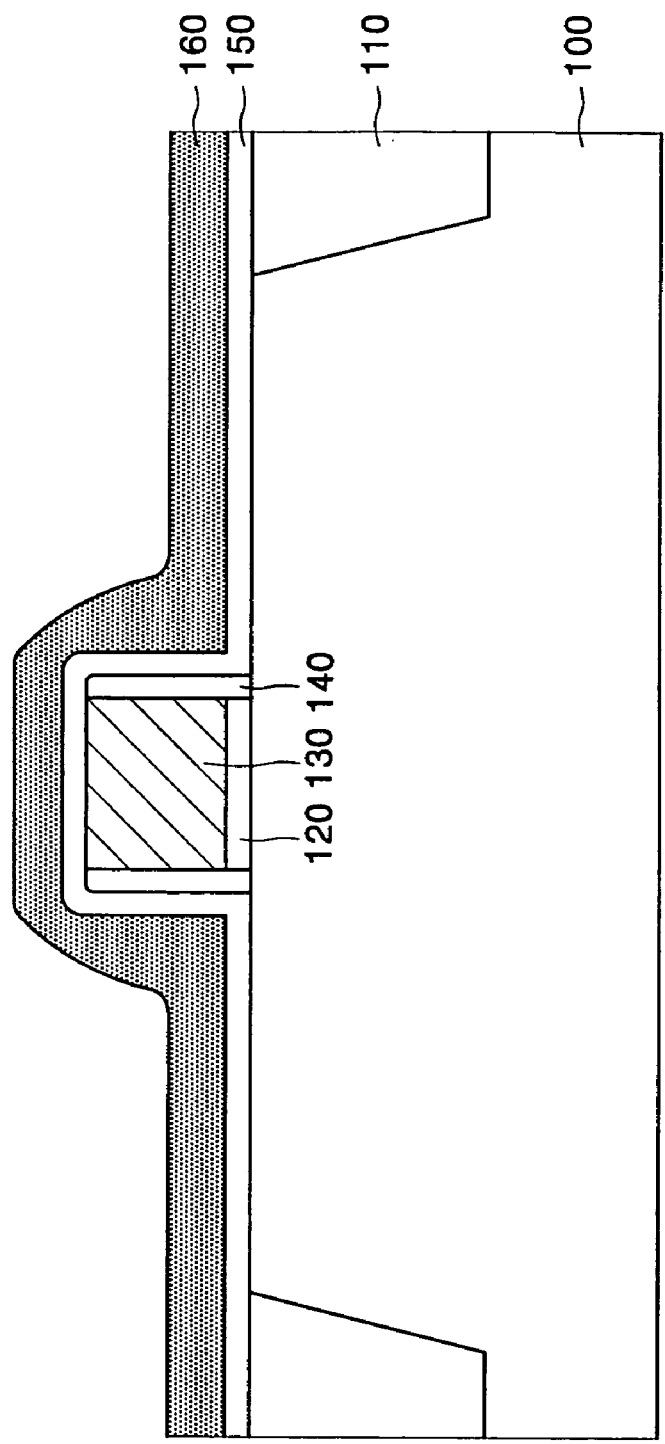

Referring to FIG. 4A, a gate insulating layer 120 is formed on a semiconductor substrate 100 having an isolation layer 110. The isolation layer 110 may be formed using an STI (shallow trench isolation) process. After the isolation layer 110 is formed, ion implantation processes for forming wells and channels (not shown) may be performed. The semiconductor substrate 100 may be a silicon substrate. The gate insulating layer 120 may be formed by depositing $SiO_2$, $Si_3N_4$, SiON, $ZrO_2$, $HfO_2$, $Ta_2O_5$, or $Al_2O_3$ on the semiconductor substrate 10 Then, a vertical gate pattern 130 is formed on the gate insulating layer 120. The vertical gate pattern 130 may be formed by forming a conductive layer such as a polysilicon layer or a metal layer on the gate insulating layer 120, and patterning it. Then, an insulating layer spacer 140 is formed on the sidewalls of the vertical gate pattern 130. The insulating layer spacer 140 may be formed by forming an insulating layer on the entire surface of the semiconductor substrate 100 having the vertical gate pattern 130, and performing an overall-etch thereon. A width of the insulating layer spacer 140 will affect a width of a horizontal gate pattern to be later formed on the vertical gate pattern 130. The width of the insulating layer spacer 140 may be varied by adjusting a thickness of the insulating layer. The insulating layer spacer 140 may be formed by forming an oxide layer with a thickness of 90 Å to 110 Å, and performing an overall-etch. the formation of the insulating layer spacer 140 may be omitted.

Then, an insulating layer 150 and a sacrificial layer 160 are sequentially formed on the entire surface of the semiconductor substrate 100 having the insulating layer spacer 140. For the simplicity of the process, the insulating layer 150 is preferably formed of the same material as the insulating layer spacer 140. The insulating layer 150 may be formed by depositing an oxide layer with a thickness of 100 Å to 150 Å by a CVD method. The sacrificial layer 160 is preferably formed of a material having an etch selectivity with respect to the vertical gate pattern 130 and the insulating layer 150. The sacrificial layer 160 may be formed by depositing a nitride layer with a thickness of 100 Å to 1,000 Å by a CVD method.

Figure 4B:
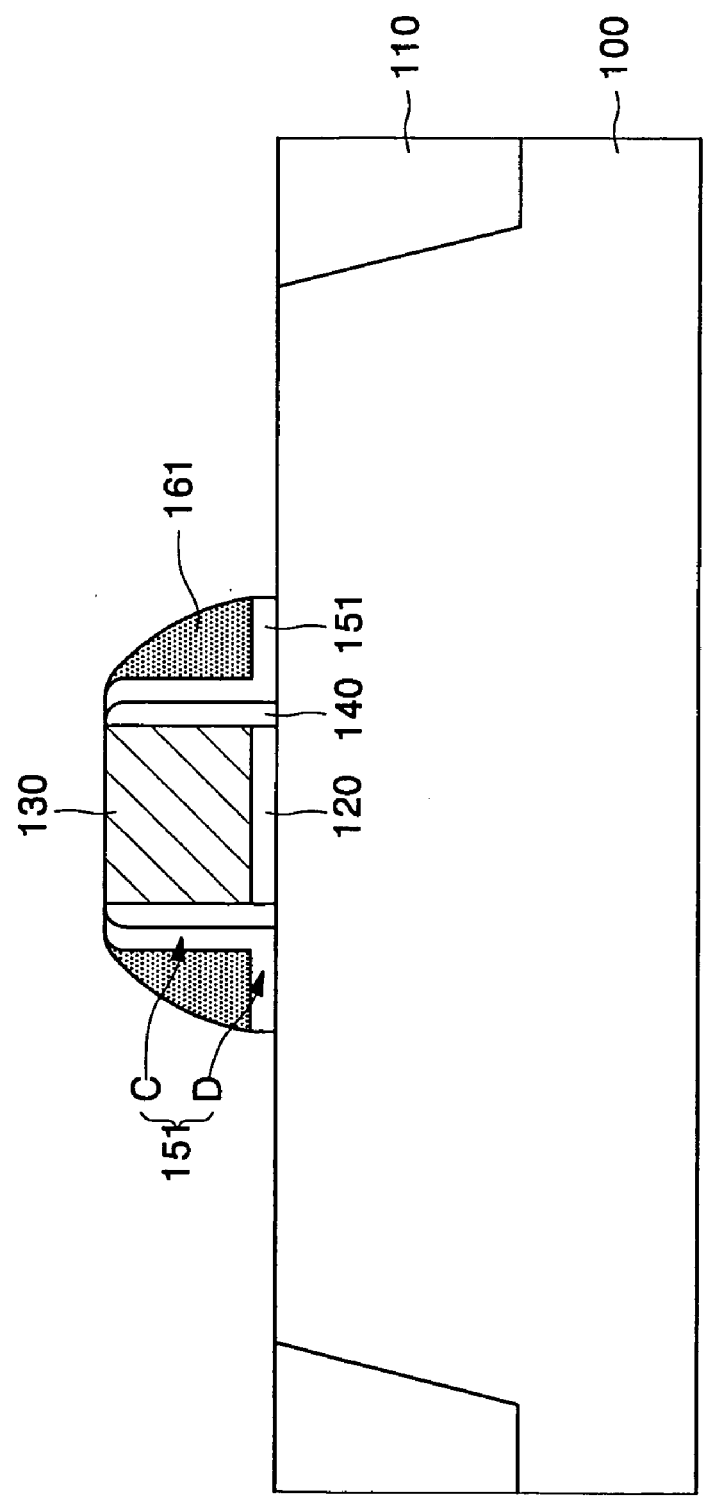

Referring to FIG. 4B, the sacrificial layer 160 and the insulating layer 150 are overall-etched until the top surface of the vertical gate pattern 130 is exposed, so as to form sacrificial spacers 161 and L-shaped spacers 151 on the sidewalls of the insulating layer spacer 140. The L-shaped spacer 151 includes a vertical portion C located between the insulating layer spacer 140 and the sacrificial spacer 161, and a horizontal portion D, which is extended from the vertical portion C and disposed between the semiconductor substrate 100 and the sacrificial spacer 161.

The sacrificial spacer 161 and the L-shaped spacer 151 may be formed during the same dry etch process. The formation process as time passes by is described as follows. First, the sacrificial layer 160 is overall-etched, so as to form sacrificial spacers 161. Then, the insulating layer 150, exposed after the sacrificial spacers 161 are formed, is overall-etched, so as to form the L-shaped spacer 151. The dry etch may be performed using $CF_4$ gas and $O_2$ gas respectively. Alternatively, the insulating layer, exposed after the sacrificial spacer is formed, may be wet-etched, so as to form the L-shaped spacer. The method of forming the L-shaped spacer by wet-etching the insulating layer will be described below.

Referring to FIG. 4C, a part of the L-shaped spacer 151 and a part of the insulating layer spacer 140 are removed by a wet etch process, so as to expose the upper sidewalls of the vertical gate pattern 130. As such, an insulating layer spacer 141 and an L-shaped spacer 152 are formed covering a part of the sidewalls of the vertical gate pattern 130. And, there is provided an empty space V between the upper sidewalls of the vertical gate pattern 130 and the sacrificial spacer 161.

Figure 4D:
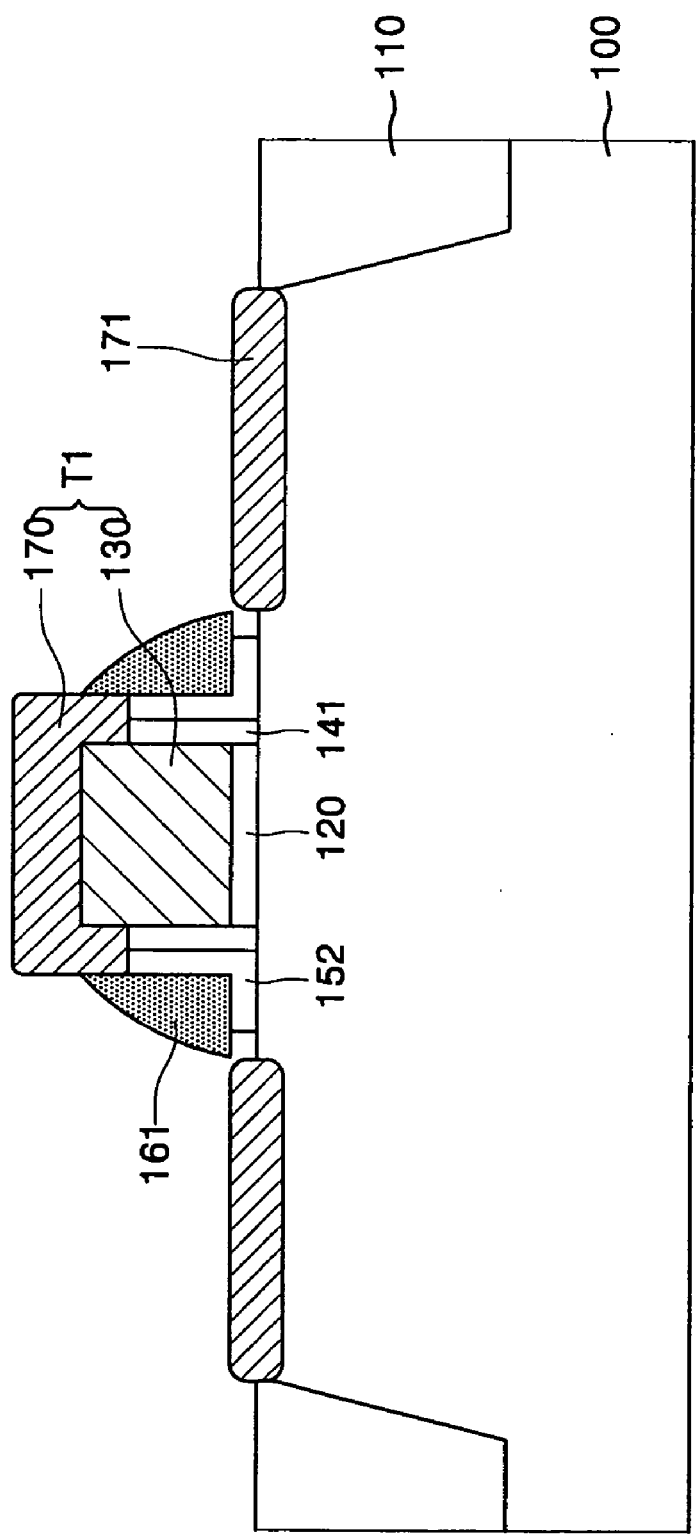

Referring to FIG. 4D, by performing a selective growth process, a horizontal gate pattern 170 is formed covering the upper surface and the upper sidewalls of the vertical gate pattern 130. Thus, there is formed a T-shaped gate T1, which is composed of the vertical gate pattern 130 and the horizontal gate pattern 170. The selective growth process may be a selective epitaxial growth.

In the case of forming the horizontal gate pattern 170 by the selective growth process, a conductive layer 171 may be formed on the semiconductor substrate, exposed on both ends of the sacrificial spacer 161, that is, on source/drain regions. The horizontal gate pattern 170 and the conductive layer 171 may be formed of an epitaxial layer having a lattice constant similar to those of the semiconductor substrate 100 and the vertical gate pattern 130. For example, in the case that the semiconductor substrate 100 is formed of a silicon substrate, and the vertical gate pattern 130 is formed of a silicon layer, the horizontal gate pattern 170 and the conductive layer 171 may be an Si layer or an SiGe layer, which is epitaxially grown. Further, the horizontal gate pattern of the T-shaped gate may be formed by a patterning process. The formation method of the horizontal gate pattern using the patterning process will be described below.

Referring to FIG. 4E, a first ion implantation is performed using the T-shaped gate T1 and the sacrificial spacer 161 as ion implantation masks, to form high concentration source/drain regions 180.

Figure 4F:
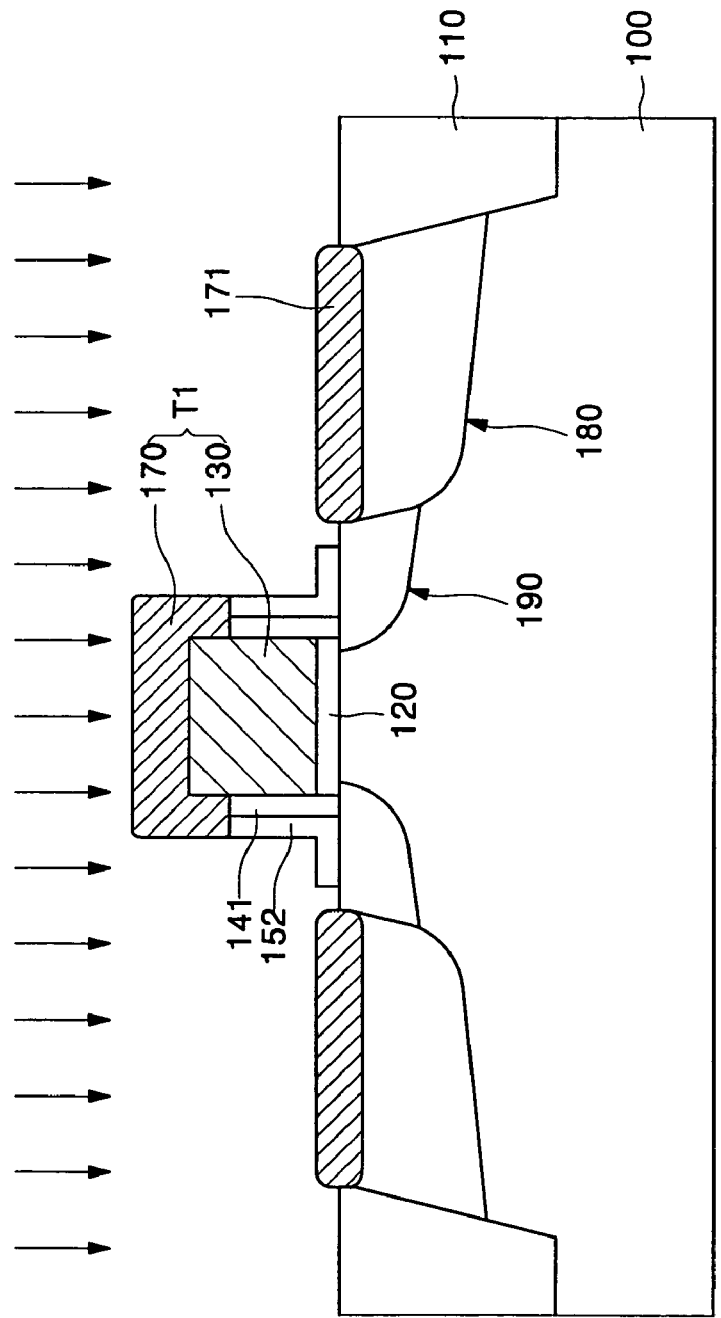

Referring to FIG. 4F, the sacrificial spacer 161 is removed to expose the L-shaped spacer 152. Then, a thermal treatment may be performed in order to activate the dopant implanted during the first ion implantation process. Then, a second ion implantation is performed using the T-shaped gate T1 and the L-shaped spacer 152 as ion implantation masks, and then, a thermal treatment is performed, so as to form low concentration source/drain regions 190.

In the case that the horizontal gate pattern 170 of the T-shaped gate T1 and the conductive layer 171 on the source/drain regions are formed of a material containing silicon, a silicide formation process may be performed as follows.

Figure 4G:
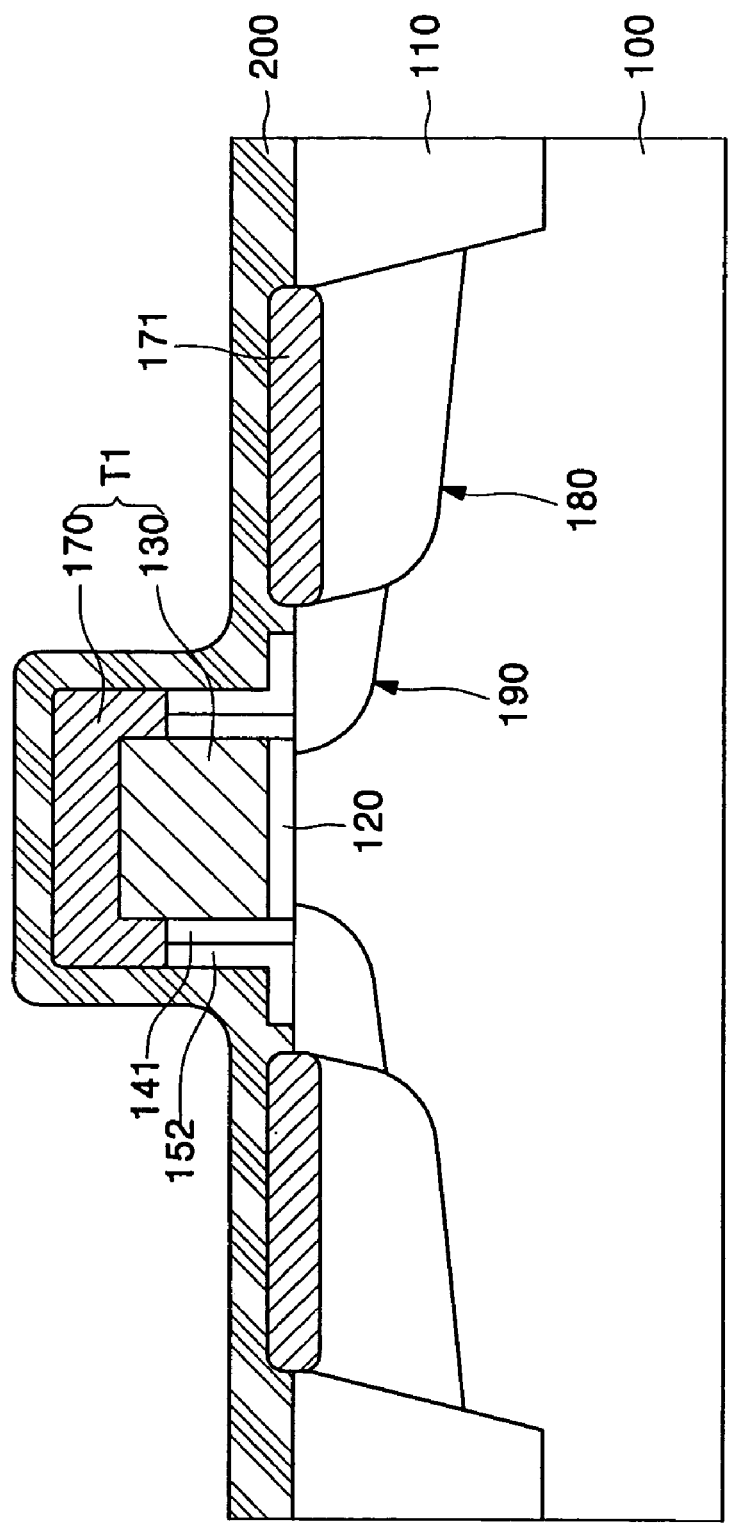

Referring to FIG. 4G, a metal layer 200 is formed on the semiconductor substrate 100 having the T-shaped gate T1 and the L-shaped spacer 152. The metal layer 200 may be formed of a cobalt (Co) layer, a titanium (Ti) layer, a tungsten (W) layer, or the like.

Figure 4H:
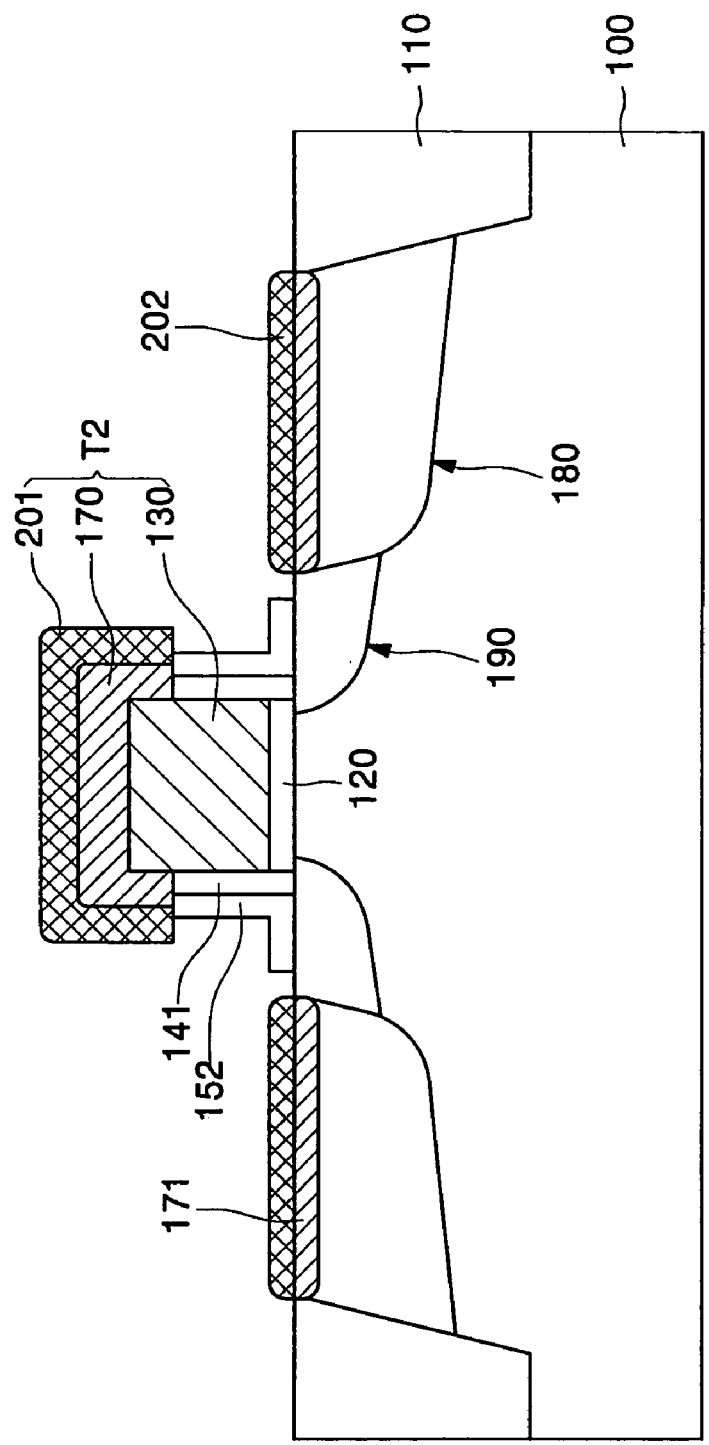

Referring to FIG. 4H, a thermal treatment is performed, so as to form a silicide layer 201 on the upper surface and the sidewalls of the horizontal gate pattern 170, and form a silicide layer 202 on the conductive layer 171. As such, there is formed a T-shaped gate T2, which is composed of the vertical gate pattern 130, the horizontal gate pattern 170 and the silicide layer 201. During the formation process of the silicide layers 201, 202, the L-shaped spacer 152 and the insulating layer spacer 141 prevent that a silicide layer is formed on the sidewalls of the vertical gate pattern 130. Further, with the formation of the silicide layers 201, 202, a part of the horizontal gate pattern 170 and a part of the conductive layer 171 may be consumed. In certain cases, all of the horizontal gate pattern 170 and the conductive layer 171 may be consumed. The metal layer 200, which is not changed into the silicide layers 201, 202 and remains, may be removed by a wet etch. For example, as described above, in the case that the metal layer 200 is formed of a Co layer, the Co layer, which is not changed into cobalt silicide, may be removed by performing a wet-etch using a mixing solution including hydrochloric acid (HCl) and hydrogen peroxide ($H_2O_2$).

Figure 5A:
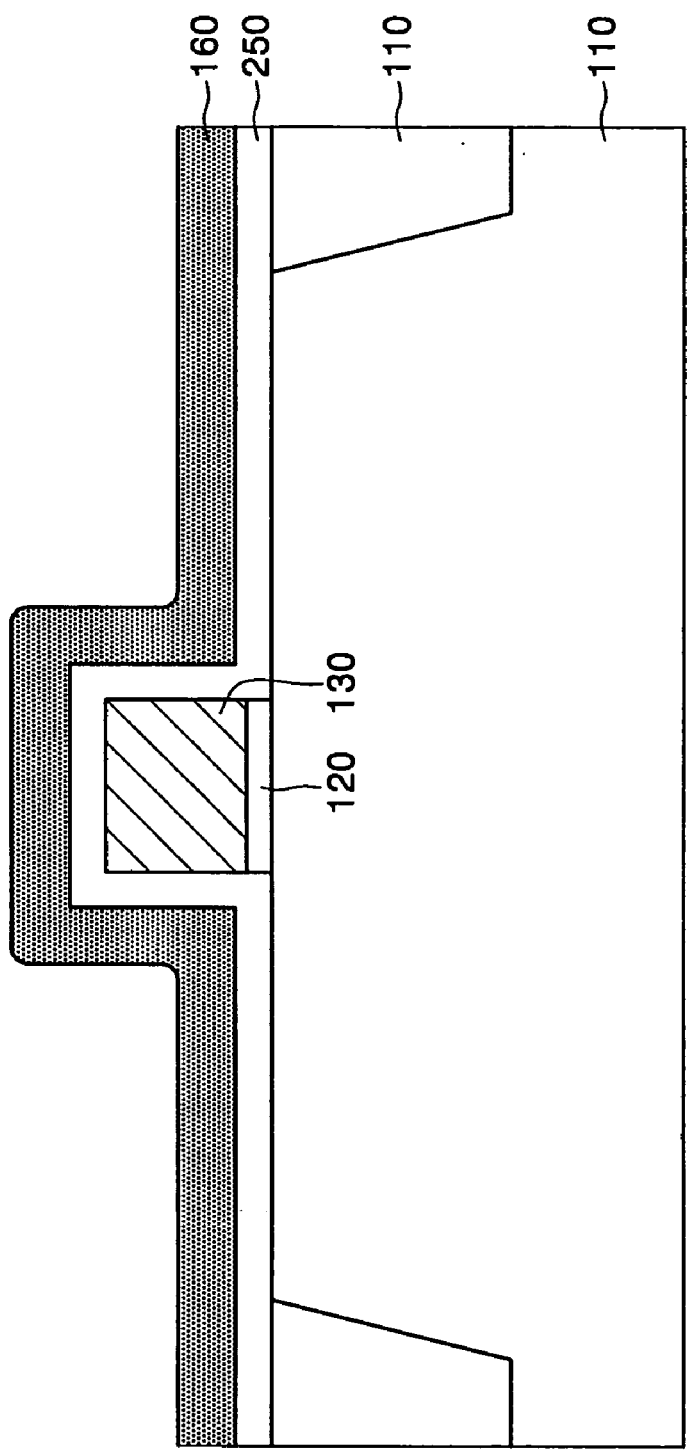

FIGS. 5A to 5F are cross-sectional views illustrating a method of fabricating a semiconductor device according to another embodiment of the present invention Referring to FIG. 5A, a gate insulating layer 120 and a vertical gate pattern 130 are formed on a semiconductor substrate 100 having an isolation layer 110. Then, an insulating layer 250 and a sacrificial layer 160 are sequentially formed on the semiconductor substrate 100 having the vertical gate pattern 130.

Referring to FIG. 5B, the sacrificial layer 160 and the insulating layer 250 are overall-etched until the upper surface of the vertical gate pattern 130 is exposed, so as to form sacrificial spacers 161 and the L-shaped spacers 251 on the sidewalls of the vertical gate pattern 130. The L-shaped spacer 251 includes a vertical portion E located between the vertical gate pattern 130 and the sacrificial spacer 161, and a horizontal portion F, which is extended from the vertical portion E, and located between the semiconductor substrate 100 and the sacrificial spacer 161. A width of the vertical portion E affects a width of the horizontal gate pattern to be formed later, and depending on a thickness of the horizontal portion F, ion implantation energy may be varied.

Figure 5C:
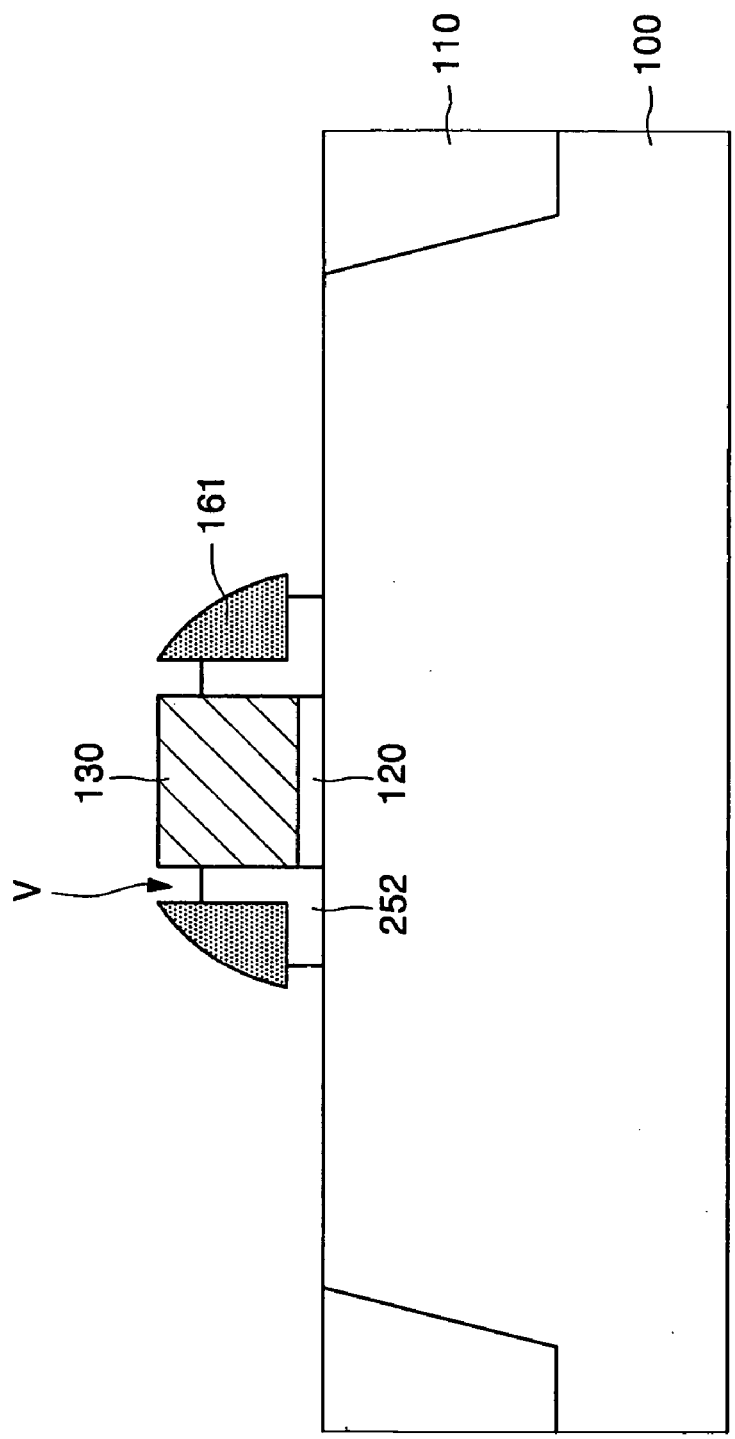

Referring to FIG. 5C, a part of the L-shaped spacer 251 may be removed by a wet etch process, so as to expose the upper sidewalls of the vertical gate pattern 130. As such, an L-shaped spacer 252 is formed covering a part of the sidewalls of the vertical gate pattern 130. Further, there is provided an empty space V between the upper sidewalls of the vertical gate pattern 130 and the sacrificial spacer 161.

Figure 5D:
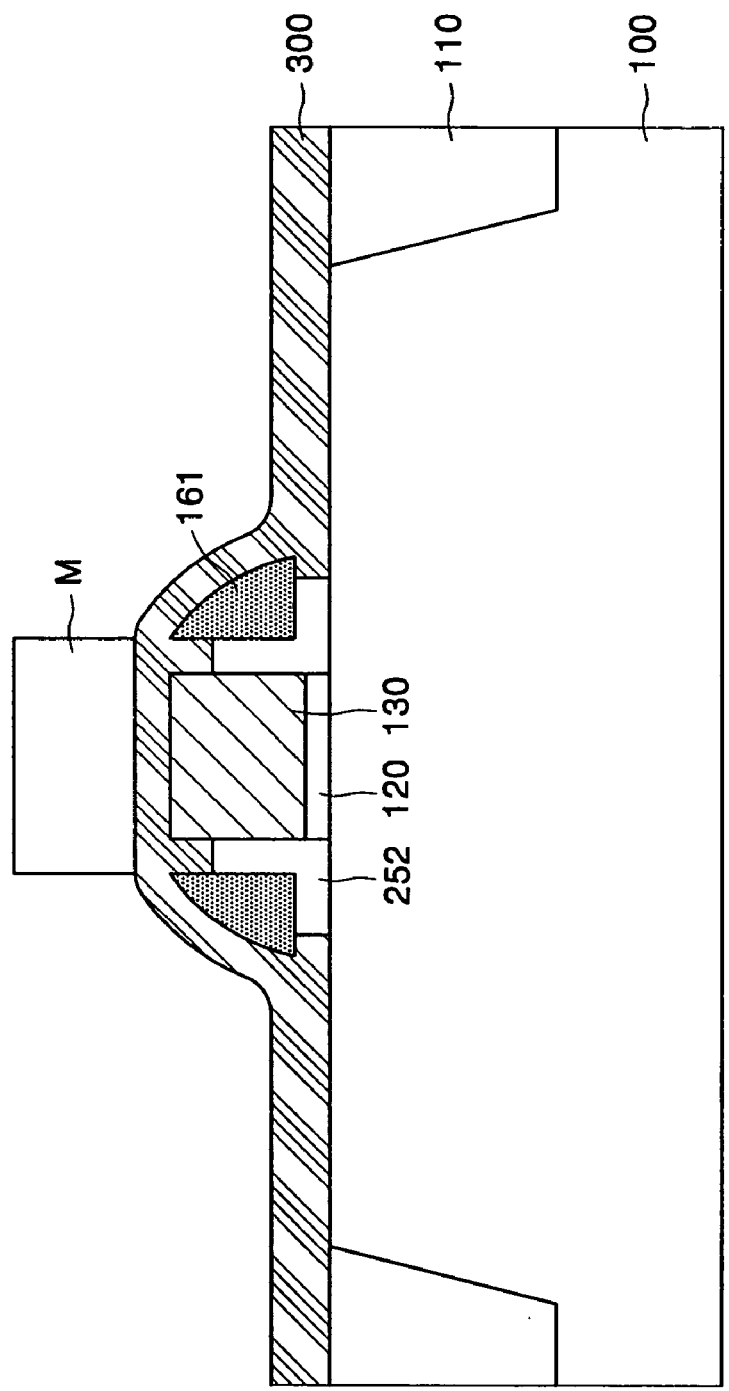

Referring to FIG. 5D, a conductive layer 300 is formed on the semiconductor substrate 100 having the empty space V. Then, a mask pattern M to define a horizontal gate pattern on the conductive layer 300 is formed. The conductive layer 300 may be formed of a polysilicon layer.

Figure 5E:
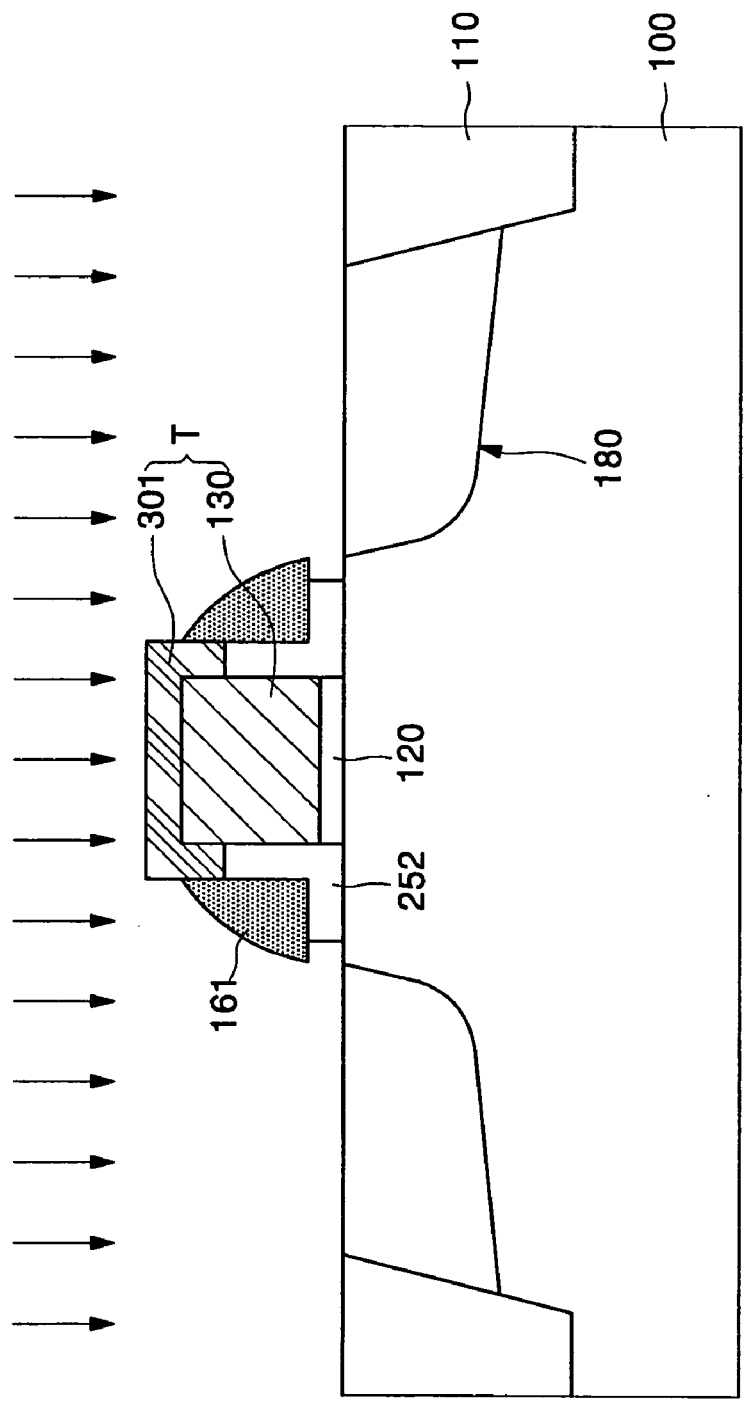

Referring to FIG. 5E, the conductive layer 300 is patterned using the mask pattern M as an etch mask, so as to form a horizontal gate pattern 301 covering the upper surface and the upper sidewalls of the vertical gate pattern 130. As such, there is formed a T-shaped gate T, which is composed of the vertical gate pattern 130 and the horizontal gate pattern 301. Then, after the mask pattern M is removed, a first ion implantation to form high concentration source/drain regions 180 is performed using the T-shaped gate T and the sacrificial spacer 161 as ion implantation masks.

Referring to FIG. 5F, the sacrificial spacer 161 is removed to expose the L-shaped spacer 252. Then, a second ion implantation is performed using the T-shaped gate T and the L-shaped spacer 252 as ion implantation masks, and then, a thermal treatment is performed, so as to form low concentration source/drain regions 190.

Further, additional etch process is performed to reduce the ion implantation energy so that a thickness of the horizontal portion F of the L-shaped spacer 252 used as the ion implantation mask can be reduced. Reference numerals, which are indicated by 'd1' and 'd2' in FIG. 5F, represent the thickness of the horizontal portion F of the L-shaped spacer 252 before and after the etch process respectively.

Then, a silicide layer may be formed in accordance with the processes shown in FIGS. 4G and 4H.

Now, hereinafter, a method of fabricating a semiconductor device according to still another embodiment of the present invention will be described in reference to FIGS. 5A, 6A, and 6B.

First, as shown in FIG. 5A, an insulating layer 250 and a sacrificial layer 160 are sequentially formed on the semiconductor substrate having the vertical gate pattern 130.

Referring to FIG. 6A, the sacrificial layer 160 is overall-etched until the insulating layer 250 is exposed, so as to form a sacrificial spacer 161 covering the sidewalls of the vertical gate pattern 130 on the insulating layer 250.

Figure 6B:
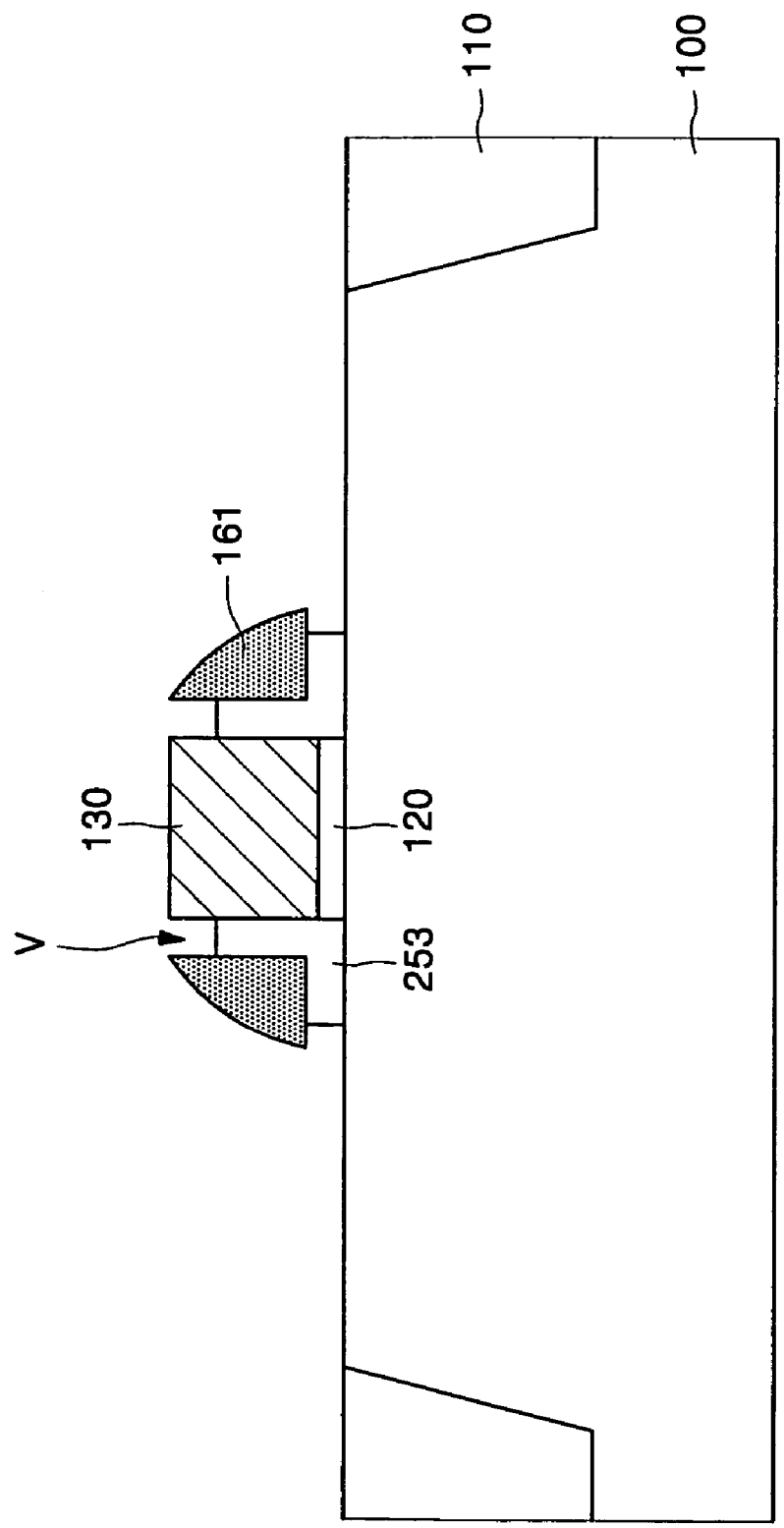

Referring to FIG. 6B, the insulating layer 250 is wet-etched, so as to form an L-shaped spacer 253 on the sacrificial spacer 161 and the vertical gate pattern 130, and there is provided an empty space V between the upper sidewalls of the vertical gate pattern 130 and the sacrificial spacer 161.

Then, the subsequent processes are performed as shown in FIGS. 4D to 4H or FIGS. 5D to 5F, so as to fabricate a semiconductor device having the T-shaped gate and the L-shaped spacer.

As described above, according to the present invention, by removing a part of the vertical portion of the L-shaped spacer while forming the L-shaped spacer on the sidewalls of the vertical gate pattern using the sacrificial spacer, there is provided an empty space between the sacrificial spacer and the vertical gate pattern, such that the horizontal gate pattern is disposed therein. Thus, a semiconductor device having the T-shaped gate and the L-shaped spacer can be readily fabricated.

What is claimed is:

1. A method of fabricating a semiconductor device comprising:
   forming a vertical gate pattern on a semiconductor substrate;
   sequentially forming an insulating layer and a sacrificial layer on the semiconductor substrate having the vertical gate pattern, the sacrificial layer being formed of a material having an etch selectivity with respect to the insulating layer;
   etching the sacrificial layer to form a sacrificial spacer;
   etching the insulating layer until at least an upper surface of the vertical gate pattern is exposed, to form an L-shaped spacer, the L-shaped spacer including a vertical portion located between sidewalls of the vertical gate pattern and the sacrificial spacer, and a horizontal portion extended from the vertical portion and located between the semiconductor substrate and the sacrificial spacer;
   selectively etching a part of the vertical portion of the L-shaped spacer, to form an empty space between upper sidewalls of the vertical gate pattern and the sacrificial spacer;
   forming a horizontal gate pattern formed of a conductive layer to fill at least the empty space, to provide a T-shaped gate composed of the vertical gate pattern and the horizontal gate pattern; and
   removing the sacrificial spacer.

2. The method according to claim 1, further comprising, after removing the sacrificial spacer, reducing a thickness of the horizontal portion of the L-shaped spacer.

3. The method according to claim 1, wherein forming the horizontal gate pattern comprises forming a conductive layer on an upper surface and upper sidewalls of the vertical gate pattern by a selective growth method.

4. The method according to claim 3, wherein forming the horizontal gate pattern comprises forming a first epitaxial layer on an upper surface and upper sidewalls of the vertical gate pattern.

5. The method according to claim 4, wherein while the horizontal gate pattern is formed, a second epitaxial layer is formed on the semiconductor substrate at both ends of the sacrificial spacer.

6. The method according to claim 5, further comprising, after forming the first epitaxial layer and the second epitaxial layer, performing an ion implantation to form high concentration source/drain regions using the T-shaped gate and the sacrificial spacer as ion implantation masks.

7. The method according to claim 6, further comprising, after removing the sacrificial spacer, performing an ion implantation using the T-shaped gate and the L-shaped spacer as ion implantation masks, to form low concentration source/drain regions inside the semiconductor substrate, overlapping the horizontal portion of the L-shaped spacer.

8. The method according to claim 7, further comprising, after removing the sacrificial spacer, reducing a thickness of the horizontal portion of the L-shaped spacer.

9. The method according to claim 5, wherein the vertical gate pattern, the first epitaxial layer and the second epitaxial layer are formed of a material containing silicon.

10. The method according to claim 9, further comprising:
    forming a metal layer on the semiconductor substrate having the first epitaxial layer and the second epitaxial layer;
    performing a thermal treatment to react the first epitaxial layer and the second epitaxial layer with the metal layer, to form silicide layers on the T-shaped gate pattern and the semiconductor substrate; and
    removing the metal layer remaining after the silicide layers are formed.

11. The method according to claim 1, wherein forming the horizontal gate pattern comprises:
    forming a conductive layer on the semiconductor substrate having the empty space; and
    patterning the conductive layer.

12. The method according to claim 11, wherein the conductive layer is formed of a polysilicon layer.

13. The method according to claim 11, further comprising, after forming the horizontal gate pattern, performing an ion implantation using the T-shaped gate and the sacrificial spacer as ion implantation masks, to form high concentration source/drain regions.

14. The method according to claim 13, further comprising, after removing the sacrificial spacer, performing an ion implantation using the T-shaped gate and the L-shaped spacer as ion implantation masks, to form low concentration source/drain regions.

15. The method according to claim 12, further comprising, after removing the sacrificial spacer, reducing a thickness of the horizontal portion of the L-shaped spacer.

16. The method according to claim 1, further comprising, after sequentially forming the insulating layer and the sacrificial layer:
    overall-etching the sacrificial layer until an upper surface of the insulating layer is exposed, to form the sacrificial spacer; and
    etching the insulating layer exposed after the sacrificial spacer is formed, to form the L-shaped spacer and the empty space at the same time.

17. A method of fabricating a semiconductor device comprising:
    forming a vertical gate pattern on a semiconductor substrate;
    forming an insulating layer spacer on sidewalls of the vertical gate pattern;
    sequentially forming an insulating layer and a sacrificial layer on the semiconductor substrate having the insulating layer spacer, the sacrificial layer being formed of a material having an etch selectivity with respect to the insulating layer;
    etching the sacrificial layer to form a sacrificial spacer;
    etching the insulating layer until at least an upper surface of the vertical gate pattern is exposed, to form an L-shaped spacer, the L-shaped spacer including a vertical portion located between the insulating layer spacer and the sacrificial spacer, and a horizontal portion extended from the vertical portion and located between the semiconductor substrate and the sacrificial spacer;
    selectively etching parts of the vertical portion of the L-shaped spacer and the insulating layer spacer, to form an empty space between upper sidewalls of the vertical gate pattern and the sacrificial spacer;
    forming a horizontal gate pattern formed of a conductive layer to fill at least the empty space, to provide a T-shaped gate being composed of the vertical gate pattern and the horizontal gate pattern; and
    removing the sacrificial spacer.

18. The method according to claim 17, wherein forming the horizontal gate pattern comprises forming a conductive layer on an upper surface and upper sidewalls of the vertical gate pattern by a selective growth method.

19. The method according to claim 18, wherein forming the horizontal gate pattern comprises forming a first epitaxial layer on an upper surface and upper sidewalls of the vertical gate pattern.

20. The method according to claim 19, wherein while the horizontal gate pattern is formed, a second epitaxial layer is formed on the semiconductor substrate at both ends of the sacrificial spacer.

21. The method according to claim 20, further comprising, after forming the first epitaxial layer and the second epitaxial layer, performing an ion implantation to form high concentration source/drain regions using the T-shaped gate and the sacrificial spacer as ion implantation masks.

22. The method according to claim 21, further comprising, after removing the sacrificial spacer, performing an ion implantation using the T-shaped gate and the L-shaped spacer as ion implantation masks, in order to form low concentration source/drain regions inside the semiconductor substrate, overlapping the horizontal portion of the L-shaped spacer.

23. The method according to claim 22, further comprising, after removing the sacrificial spacer, reducing a thickness of the horizontal portion of the-L-shaped spacer.

24. The method according to claim 20, wherein the vertical gate pattern, the first epitaxial layer and the second epitaxial layer are formed of a material containing silicon.

25. The method according to claim 24, further comprising:

forming a metal layer on the semiconductor substrate having the first epitaxial layer and the second epitaxial layer;

performing a thermal treatment to react the first epitaxial layer and the second epitaxial layer with the metal layer, to form silicide layers on the T-shaped gate pattern and the semiconductor substrate; and removing the metal layer remaining after the silicide layers are formed.

26. The method according to claim 17, wherein forming the horizontal gate pattern comprises:

forming a conductive layer on the semiconductor substrate having the empty space; and patterning the conductive layer.

27. The method according to claim 26, wherein the conductive layer is formed of a polysilicon layer.

28. The method according to claim 25, further comprising, after forming the horizontal gate pattern, performing an ion implantation using the T-shaped gate and the sacrificial spacer as ion implantation masks, to form high concentration source/drain regions.

29. The method according to claim 28, further comprising, after removing the sacrificial spacer, performing an ion implantation using the T-shaped gate and the L-shaped spacer as ion implantation masks, to form low concentration source/drain regions.

30. The method according to claim 29, further comprising, after removing the sacrificial spacer, reducing a thickness of the horizontal portion of the L-shaped spacer.

* * * * *